(12) United States Patent
Takaoka

(10) Patent No.: US 6,534,722 B2
(45) Date of Patent: Mar. 18, 2003

(54) FLAT PANEL TYPE DISPLAY APPARATUS

(75) Inventor: Takuya Takaoka, Shizuoka-ken (JP)

(73) Assignees: Pioneer Corporation, Tokyo (JP); Shizuoka Pioneer Corporation, Shizuoka-ken (JP)

( * ) Notice: Subject to any disclaimer, the term of this patent is extended or adjusted under 35 U.S.C. 154(b) by 0 days.

(21) Appl. No.: 10/132,169

(22) Filed: Apr. 26, 2002

(65) Prior Publication Data
US 2002/0174998 A1 Nov. 28, 2002

(30) Foreign Application Priority Data
May 24, 2001 (JP) ........................ 2001-155152

(51) Int. Cl.[7] .......................... H05K 7/14; G02F 1/1345
(52) U.S. Cl. ........................ 174/254; 349/150; 361/749
(58) Field of Search .......................... 349/32, 58, 150, 349/151; 438/15; 174/68.1, 51, 254; 361/749, 750, 751, 789; 439/493

(56) References Cited

U.S. PATENT DOCUMENTS

| | | | |
|---|---|---|---|
| 5,173,844 A | * 12/1992 | Adachi et al. | 174/255 |
| 5,680,183 A | * 10/1997 | Sasuga et al. | 349/58 |
| 5,726,491 A | * 3/1998 | Tajima et al. | 358/1.18 |
| 5,737,053 A | * 4/1998 | Yomogihara et al. | 349/149 |
| 6,104,464 A | * 8/2000 | Adachi et al. | 349/150 |
| 6,392,143 B1 | * 5/2002 | Koshio | 174/52.4 |
| 6,407,796 B2 | * 6/2002 | Tajima et al. | 349/150 |
| 6,456,344 B1 | * 9/2002 | Nemoto et al. | 349/150 |

* cited by examiner

Primary Examiner—Dean A. Reichard
Assistant Examiner—Adolfo Nino
(74) Attorney, Agent, or Firm—Arent Fox Kintner Plotkin & Kahn

(57) ABSTRACT

A flexible wiring tape mounting driving ICs for driving a display body at the back surface of a metal chassis which supports the display body at a back surface thereof is provided in a flat panel type display apparatus. On the flexible wiring tape, grounding wiring pattern is provided, which is connected with a rear surface of each driving IC through a electrically conductive tape. The conductive tape is provided with an adhesive layer having an electrical conductivity and a high heat conductivity on the both sides thereof, wherein it is adhered to both the flexible wiring tape and the metal chassis, so that both the grounding function and the heat radiating function of the driving IC can be accomplished. Thus, in addition to the above effects, the flat panel type display apparatus can be provided with a mounting structure of the driving ICs capable of realizing a simpler structure and a lower production cost.

7 Claims, 5 Drawing Sheets

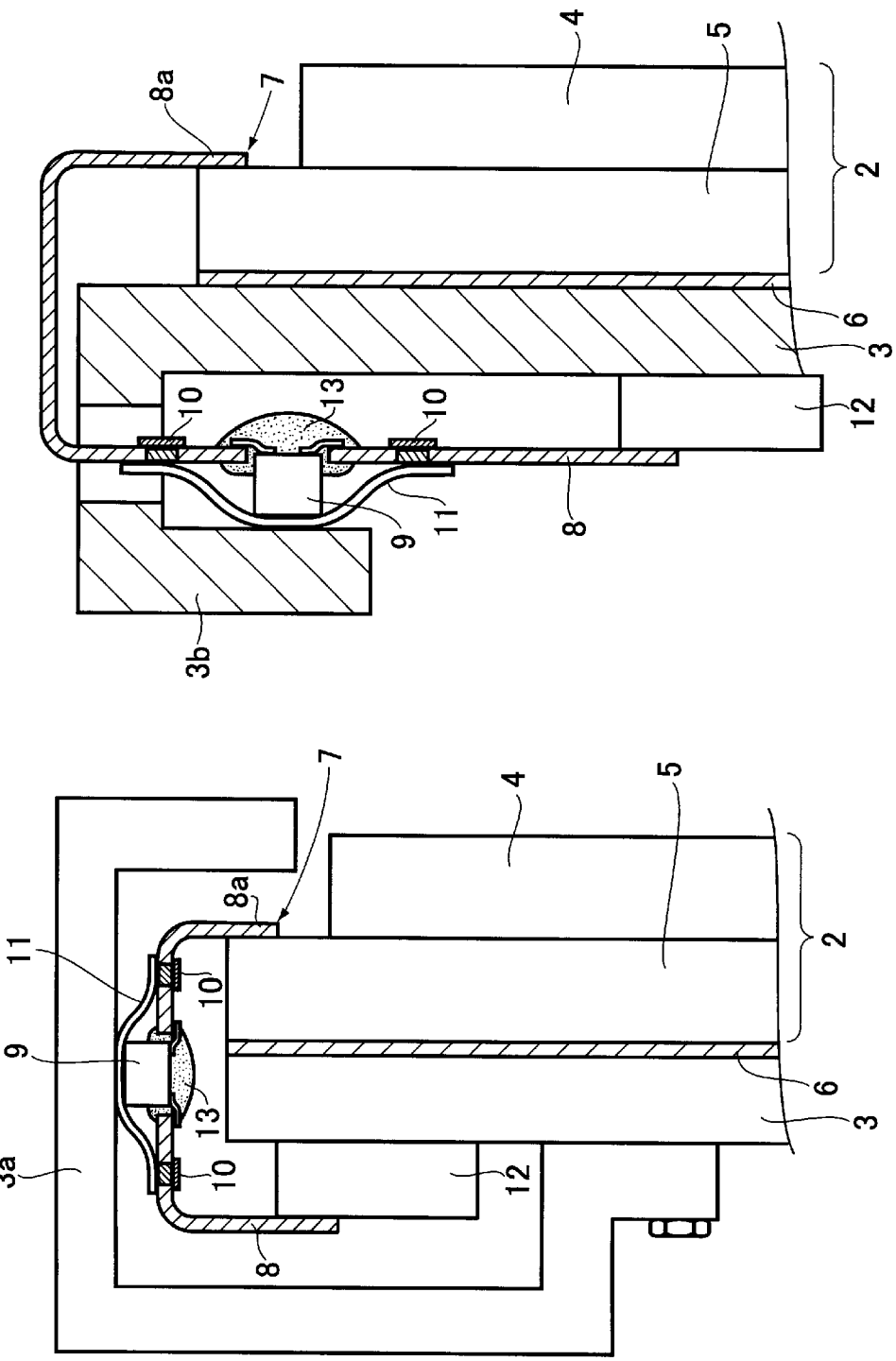

FLAT PANEL TYPE DISPLAY APPARATUS

BACKGROUND OF THE INVENTION

1. Field of the Invention

The present invention relates to a flat panel type display apparatus such as a plasma display panel (hereinafter referred to as PDP) or the like, and more particularly to a mounting structure of a integrated circuit device for driving the flat panel type display apparatus.

The present application claims priority from Japanese Application No. 2001-155152, the disclosure of which is incorporated herein by reference for all purposes.

2. Description of the Related Art

In these years, the PDP has been developed, and particularly a color plasma display panel has been rapidly researched for development as a display apparatus of the next generation.

In order to achieve higher definition of a display screen in the research, necessitated is mounting of many integrated circuit devices for driving (hereinafter referred to as driving ICs) in high density. For doing so, it is indispensable to have a mounting structure superior in heat radiation, capable of improving the withstand voltage characteristic, and the like, particularly when the driving ICs for driving at a high voltage and high power such as the PDP are mounted in the high density.

For example, the TCP(tape carrier package) for mounting the driving IC using a mounting technology such as, for example, TAB (tape automated bonding), COF (chip on FPC), or the like, is used for connecting the driving IC with electrode terminals formed on a substrate of a flat display panel such as the PDP. In such a mounting of the driving IC, particularly, it has been expected to take a countermeasure capable of sufficiently securing the heat radiation and the withstand voltage characteristic, and also of realizing a simple mounting structure.

SUMMARY OF THE INVENTION

Accordingly, an object of the present invention is to solve such problems, and more particularly to provide a flat panel type display apparatus having a mounting structure for a driving IC capable of obtaining the superior heat radiation and withstand voltage characteristic, and realizing a simpler structure and lower production cost.

In order to achieve the above-described object, the present invention provides a flat panel type display apparatus, comprising a flat display body, a metal chassis for supporting the display body at a back surface thereof, a flexible wiring tape electrically connected with the display body, having predetermined wiring patterns including a grounding wiring pattern formed thereon, driving ICs mounted on the flexible wiring tape, and a thermally and electrically conductive tape, wherein a rear surface of each driving IC is connected with the grounding pattern formed on the flexible wiring tape through the conductive tape.

According to the above mentioned structure, the rear surface of the driving IC mounted on the flexible wiring tape is connected with the grounding pattern through the conductive tape, so that the rear surface of the driving IC can be surely grounded. As a result, the withstand voltage characteristic can be improved. In addition, the heat generated when the flat display panel is driven to be displayed by the driving IC can be effectively radiated by a heat radiation function of the conductive tape. Since these effects can be produced by a simpler mounting structure with the conductive tape, the mounting density of the driving ICs having a high voltage and a high electric power can be improved.

In the flat panel type display apparatus of the present invention, further the conductive tape is an adhesive tape with an adhesive layer provided upon a surface thereof, which is adhered upon the rear surface of driving IC and a surface of the grounding pattern.

According to the above mentioned structure, the connection between the rear surface of the driving IC and the surface of the grounding pattern is completed just through adhering the conductive adhesive tape, so that the workhours of mounting step can be shortened, and a production cost also can be reduced.

In the flat panel type display apparatus of the present invention, further the conductive tape is a double-surfaces adhesive tape having adhesive layers on both sides thereof, one surface being adhered onto the driving ICs and the grounding pattern, and also another being adhered onto the metal chassis.

According to the above mentioned structure, the driving ICs can be easily fixed onto the metal chassis, so that the stability of the driving IC to be mounted increases. In addition, the driving IC's contact with the metal chassis can improve the function of heat radiation.

In the flat panel type display apparatus of the present invention, further the flexible wiring tape has a plurality of apertures thereon, and the driving ICs are connected with the wiring patterns formed on an outside surface of the flexible wiring tape by metal lead members passing through the apertures.

According to the above mentioned structure, the conductive tape is adhered upon a surface opposite to a wiring pattern forming surface on the flexible wiring tape, so that a short circuit generated between the wiring pattern and the conductive tape can be prevented. As a result, it results in allowing a large area of conductive tape to be attached, thereby further improving the effect of heat radiation.

BRIEF DESCRIPTION OF THE DRAWINGS

These and other objects and advantages of the present invention will become clear from the following description with reference to the accompanying drawings, wherein:

FIGS. 5(a) and 5(b) are schematic sectional views illustrating the other embodiments, corresponding to FIGS. 1 and 3.

DETAILED DESCRIPTION OF THE PREFERRED EMBODIMENTS

Figure 1:
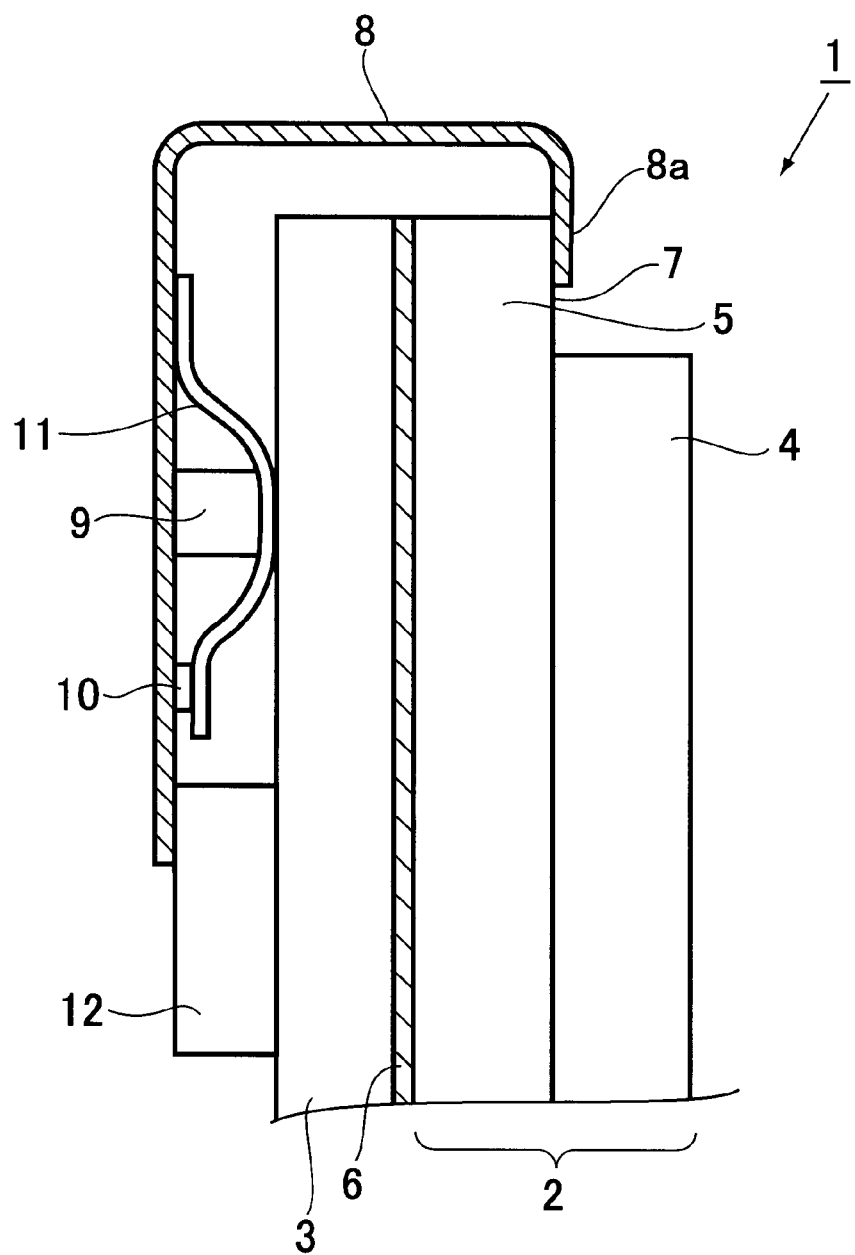
FIG. 1 is a sectional view illustrating a longitudinal sectional structure of a critical portion of a color plasma display panel according to an embodiment of the present invention.
Figure 2:
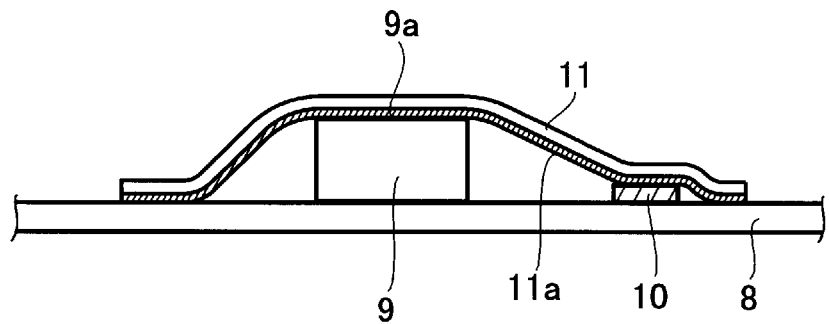
FIG. 2(a) is a schematic sectional view illustrating a mounting structure for mounting a driving IC on a flexible wiring tape of FIG. 1.
FIG. 2(b) is a top plan view of FIG. 2(a)
Figure 2:
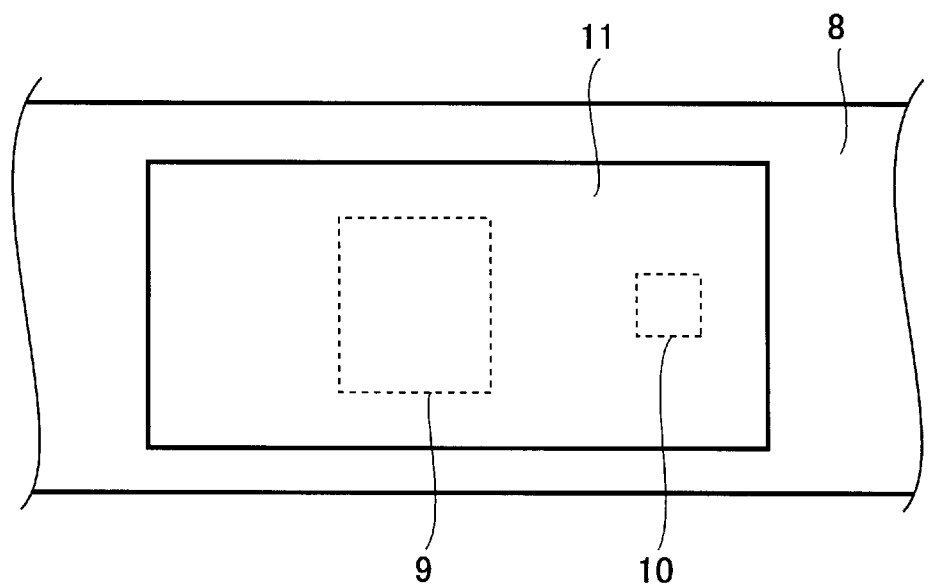

A first embodiment of a flat panel type display apparatus according to the present invention will be described with reference to FIGS. 1 and 2. It should be noted that a color plasma display panel having a mounting structure of a driving IC according to the present invention is described as an embodiment of the flat panel type display apparatus. FIG. 1 is a sectional view illustrating a longitudinal sectional structure of a critical portion of the color plasma display panel, and FIGS. 2(a) and 2(b) are schematic views illustrating a mounting structure using a flexible wiring tape.

In FIG. 1, the color plasma display panel 1 comprises a display body 2, a metal chassis 3 for supporting the display body 2, wherein a driving IC 9(silicon chip, semiconductor chip) and the like are wired by a flexible wiring tape 8 to be mounted on a back side of the metal chassis 3 as well as a printed board 12.

The display body 2, having a flat shape, comprises a front glass substrate 4 and a back glass substrate 5 arranged opposing each other with a discharge space having a rare gas sealed therein interposed therebetween. On an internal surface of the front glass substrate 4 (a surface facing to the back glass substrate 5), a multiplicity of row electrode pairs covered by dielectric layers are regularly arranged, and on an internal surface of the back glass substrate 5 (a surface facing to the front glass substrate 4), a multiplicity of column electrodes covered by fluorescent material layers of respective colors are orthogonally arranged in relation to the row electrode pairs. Respective intersections of the row electrode pairs and the column electrodes operate as color discharge cells. When the driving IC 9 supplies driving power for displaying to the row electrode pairs and column electrodes based on display data, the color discharge cells are discharged to be illuminated, thereby a color image is displayed.

The flat display body 2 is fixed to the flat metal chassis 3 formed of aluminum or the like by an adhesive material 6 such as a double-sides adhesive tape and is integrated therewith.

Draw-out terminals (hereinafter referred to as column electrode terminals) connected with the column electrodes are formed in alignment at a side edge 7 of the front surface of the back glass substrate 5, and draw-out terminals (hereinafter referred to as row electrode terminals) connected with the row electrode pairs are formed in alignment also at a side edge (not shown) of the back surface of the front glass substrate 4.

Wiring patterns for predetermined signal transmission are previously formed in addition to grounding wiring patterns and power source wiring patterns on the flexible wiring tape 8, and a driving IC module(TCP), which is the flexible wiring tape 8 previously provided with the driving IC 9, is formed by electrically connecting one or more driving ICs 9 to these wiring patterns. Then, an edge 8a of the flexible wiring tape 8 composing the module is fixed to the side edge 7 of the back glass substrate 5 and the above-described side edge of the front glass substrate 4, and then a predetermined connecting edges of the wiring patterns formed at the edge 8a of the flexible wiring tape 8 are electrically connected with the column electrode terminals and row electrode terminals through an anisotropic conductive adhesive sheet or the like. Thus, the driving IC module and the display body 2 are electrically connected with each other. Moreover, a connecting structure between the side edge of the front glass substrate 4 and the wiring tape 8 is not shown in FIG. 1.

Here, the driving IC module is formed in the following way. In FIG. 2(a), the predetermined wiring patterns as mentioned above are previously formed on the flexible wiring tape 8, so that the flexible wiring tape 8 capable of conducting TAB(Tape Automated Bonding) can be obtained.

When the driving IC 9 is mounted on the flexible wiring tape 8, the driving IC 9 is positioned and disposed in relation to the flexible wiring tape 8, while automatically carrying the flexible wiring tape 8, by an automatic mounting machine. Then, a side of bonding pad or electric circuit surface formed on the driving IC 9 is contacted to the wiring patterns of the flexible wiring tape 8, while a rear surface 9a of the driving IC 9 is disposed facing upward in relation to the flexible wiring tape 8.

Upon the rear surface 9a of the driving IC which is mounted on the flexible wiring tape 8 as mentioned above, a metal plate film of chromium and gold is formed. The metal plate film is formed by plating chromium and gold after removing a oxide film of the rear surface through grinding it by a grinder.

Next, an electrically conductive tape 11 having an adhesive material layer 11a is adhered onto a surface of a grounding wiring pattern 10, which is formed on the flexible wiring tape 8, and also onto the rear surface 9a of each driving IC 9, which becomes electrically conductive condition by the plating treatment as mentioned above, respectively, as a result of which the driving IC 9 is connected with the grounding wiring pattern 10 through the conductive tape 11.

By virtue of such a structure, formed is the driving IC module capable of efficiently radiating the heat generated by the driving ICs 9 through the conductive tape 11, and also capable of sufficiently stabilizing a ground potential of the driving ICs 9.

Next, the edge 8a of the flexible wiring tape 8 is fixed to the side edge 7 of the back glass substrate 5 and the above-described side edge of the front glass substrate 4 when the driving IC module as mentioned above is mounted on the display body 2 and the metal chassis 3 as shown in FIG. 1. Then, the predetermined connecting edges of the wiring patterns formed at the edge 8a of the flexible wiring tape 8 are electrically connected with the column electrode terminals and row electrode terminals through the anisotropic conductive adhesive sheet(not shown) or the like. Furthermore, the other surface of the conductive tape 11, which is a surface opposing to the surface as adhered with the driving IC 9, is adhered with a back surface of the metal chassis 3, after introducing the flexible wiring tape 8 to the back surface side of the metal chassis 3, thereby manufactured is the color plasma display panel 1 in a blank unit before being subjected to decorative treatment or the like.

When adhering the conductive tape 11 to the back surface of the metal chassis 3 like this, the tape 11 may be a conductive tape capable of adhering the both sides thereof, which has adhesive layers provided with the electrical conductivity and a high heat conductivity upon the both sides, so that the adhering work can be rapidly completed.

In this way, according to the mounting structure of the driving IC of the present embodiment, the heat generated at the side of the driving IC when the display body 2 is driven by the driving IC 9 is efficiently conducted to the conductive tape 11, thus the heat radiation of the apparatus A can be improved by employing the conductive tape 11 having a wide surface area and the heat conductivity (see FIG. 2(b)). Additionally, since the conductive tape 11 is adhered to the metal chassis 3, the heat radiation of the metal chassis 3 also is accomplished. In a word, according to the present invention, an extremely preferable effect of heat radiation can be obtained.

In addition, the rear surface 9a(metal chassis side) of the driving IC 9 which is subject to a conductive treatment, is connected to the grounding wiring pattern 10 through the conductive tape 11, so that a ground potential of the driving IC 9 can be kept with the same potential as that of the grounding wiring pattern 10 of the flexible wiring tape 8. As a result, a withstand voltage characteristic can be improved.

Figure 3:
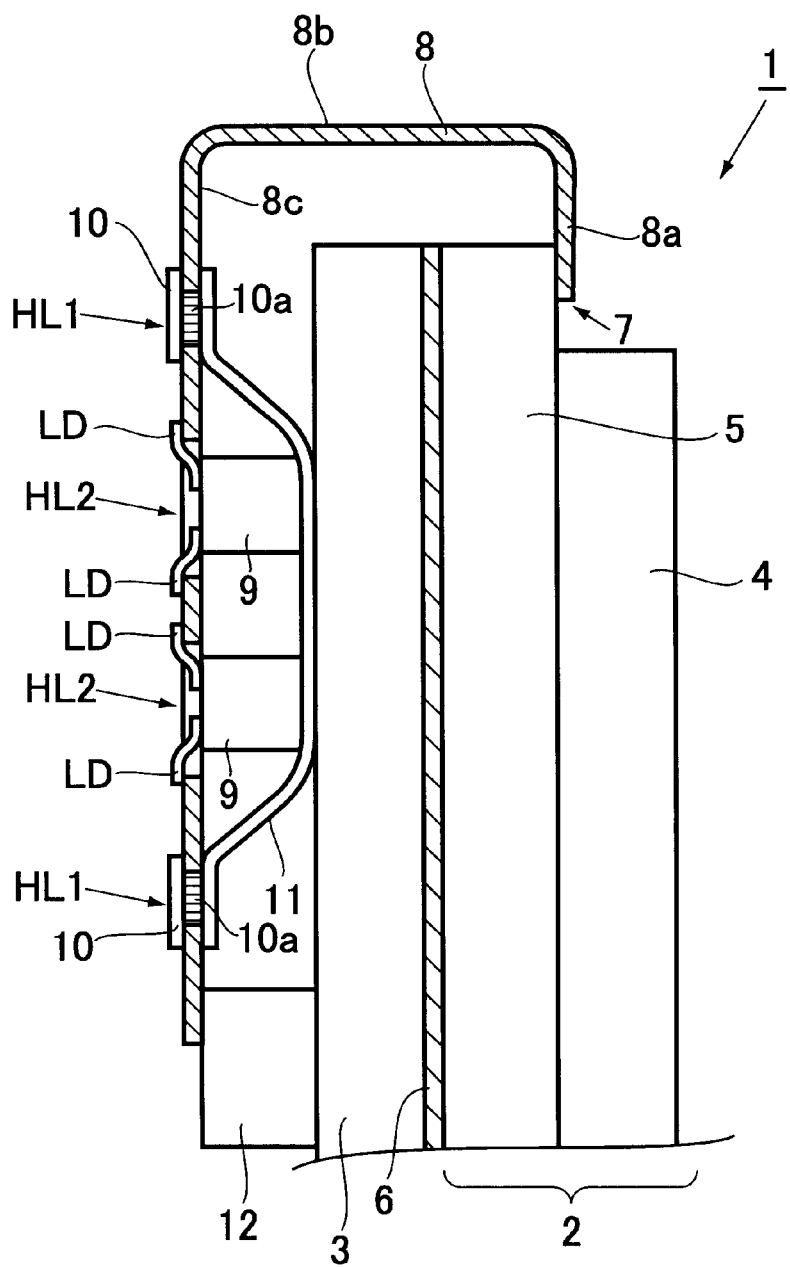
FIG. 3 is a sectional view illustrating a longitudinal sectional structure of a critical portion of a color plasma display panel according to another embodiment.

FIG. 3 is a longitudinal sectional view of a critical portion illustrating another embodiment of the present invention. It should be noted that, in FIG. 3, equivalent portions with those in FIG. 1 are designated by the same reference numerals.

A main difference in a structure of the flat panel type display apparatus as shown in FIG. 3 from that shown in FIG. 1 is that a wiring pattern forming surface 8b of the flexible wiring tape 8 is provided on an outside surface of the tape 8 so as to prevent the wiring pattern formed on the tape 8 from interfering with the conductive tape 11.

Moreover, the grounding wiring patterns 10 formed on the wiring pattern forming surface 8b of the flexible wiring tape 8 has electrodes 10a to be exposed on a surface 8c opposing to the wiring pattern forming surface 8b through one or more apertures HL1 formed on the flexible wiring tape 8. The electrodes 10a are connected with each rear surface of the driving ICs 9 through the conductive tape 11.

Furthermore, the driving ICs 9 are connected with the wiring patterns provided on the wiring pattern forming surface 8b of the flexible wiring tape 8 by one or a plurality of metal lead members LD through one or a plurality of apertures HL2 formed on the flexible wiring tape 8.

In this way, according to the second embodiment, the large size of conductive tape 11 can be mounted while previously preventing short circuit (electrical short circuit) against the wiring patterns by directly mounting the conductive tape 11 on the surface 8c opposite to the wiring pattern forming surface 8b of the flexible wiring tape 8, and also a plurality of apertures HL1, HL2 are provided on the flexible wiring tape 8, thus the heat radiation effect of the driving ICs 9 can be further improved.

Figure 4:
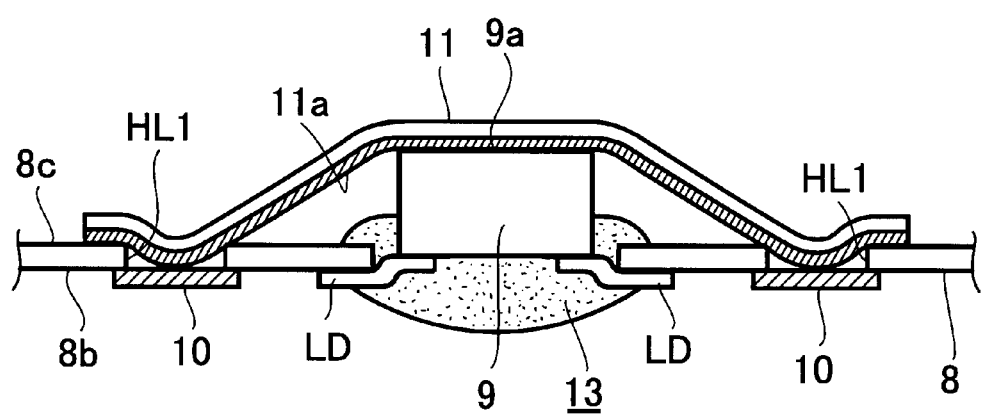
FIG. 4 is a schematic sectional view illustrating a connecting condition between the driving IC and the flexible wiring tape in the embodiment of FIG. 3.

Moreover, in the driving IC module as shown in FIG. 4, a connecting portion between the driving IC 9 and the flexible wiring tape 8 may be covered with a resign 13. In addition, the grounding wiring pattern 10, which is formed on the wiring pattern forming surface 8b of the flexible wiring tape 8, may be connected with the conductive tape 11 disposed on the opposite surface 8c through the apertures HL1 in the same drawing.

Further, FIGS. 5(a) and 5(b) are explanatory views showing modified examples corresponding to a various kind of metal chassis formation. As a structure mounting the driving IC module upon the display body 2 and the metal chassis 3, an auxiliary chassis 3a to enclose respective upper portions of both the display body 2 and the metal chassis 3 may be fixed with the metal chassis 3, an inside surface of the auxiliary chassis 3a being adhered with an outside surface of the conductive tape 11, which is a surface opposing to a surface adhered upon the driving IC 9, as shown in FIG. 5(a). In addition, FIG. 5(b) discloses the metal chassis 3 having a bent portion formed upon an end of the metal chassis 3, where the driving IC module is introduced through an aperture provided on the bent portion 3b, and then the bent portion 3b may be adhered to the outside surface of the conductive tape 11 as well as that of FIG. 5(a).

According to each embodiment as mentioned above, each rear surface 9a of the driving ICs 9 provided on the flexible wiring tape 8 is connected with the grounding wiring pattern 10 through the conductive tape 11. Thereby, the rear surface 9a of the driving IC 9 can be surely grounded, as a result of which the withstand voltage characteristic can be improved based on a shield effect. Further, the heat generated when the color plasma display panel is driven by the driving IC 9 can be effectively radiated by a heat radiation function of the conductive tape 11. Since both the heat radiation and withstand voltage characteristics can be improved by the simple mounting structure, a mounting density of the driving ICs and the like can be improved.

On the other hand, since the connection is completed by just adhering the conductive adhering tape 11 upon both the rear surface 9a of the driving ICs 9 and the surface of the grounding wiring pattern 10, workhours for a mounting step thereof can be shortened. Furthermore, the connection step can be completed in the same process as the mounting of the driving IC and the grounding wiring pattern, thus the production cost of the apparatus can be reduced because of the simple manufacturing step.

While the invention has been described in conjunction with preferred specific embodiments thereof, it will be understood that this description is intended to illustrate and not limit the scope of the invention, which is defined by the following claims.

What is claimed is:

1. A flat panel type display apparatus, comprising:
   a flat display body;
   a metal chassis for supporting said display body at a back surface thereof;
   a flexible wiring tape electrically connected with said display body, having predetermined wiring patterns including a grounding wiring pattern formed thereon;
   driving ICs mounted on said flexible wiring tape; and
   a thermally and electrically conductive tape,
   wherein a rear surface of said each driving IC is connected with said grounding pattern formed on the flexible wiring tape through said conductive tape.

2. The flat panel type display apparatus according to claim 1, wherein:
   said conductive tape is an adhesive tape with an adhesive layer on a surface thereof, which is adhered upon said rear surface of each driving IC and a surface of said grounding pattern.

3. The flat panel type display apparatus according to claim 1, wherein:
   said conductive tape is a double-surfaces adhesive tape having adhesive layers on both sides thereof, one surface being adhered onto said driving IC and said grounding pattern, and also another being adhered onto said metal chassis.

4. The flat panel type display apparatus according to claim 1, wherein:
   said driving ICs are semiconductor integrated circuit devices.

5. The flat panel type display apparatus according to claim 1, wherein:
   said flexible wiring tape prints wiring patterns for grounding, power source and signal transmission thereon.

6. The flat panel type display apparatus according to claim 1, wherein:
   said flexible wiring tape has a plurality of apertures thereon, and further
   said driving ICs are connected with said wiring patterns formed on an outside surface of the flexible wiring tape by metal lead members passing through said apertures.

7. The flat panel type display apparatus according to claim 1, wherein:
   said flat panel type display apparatus is a color plasma display panel.

\* \* \* \* \*